(12) United States Patent
Harada et al.

(10) Patent No.: US 6,710,730 B2
(45) Date of Patent: Mar. 23, 2004

(54) LADDER RESISTOR WITH REDUCED INTERFERENCE BETWEEN RESISTOR GROUPS

(75) Inventors: Hisashi Harada, Tokyo (JP); Takahiro Miki, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/900,018

(22) Filed: Jul. 9, 2001

(65) Prior Publication Data

US 2002/0080054 A1 Jun. 27, 2002

(30) Foreign Application Priority Data

Dec. 26, 2000 (JP) ......................................... 2000-396013

(51) Int. Cl.[7] ................................................ H03M 1/78
(52) U.S. Cl. ........................ 341/154; 341/145; 341/153; 341/159
(58) Field of Search ................................ 341/154, 159, 341/145, 153, 144, 155

(56) References Cited

U.S. PATENT DOCUMENTS 5,495,245 A * 2/1996 Ashe ........................... 341/145
5,703,588 A * 12/1997 Rivoir et al. ................ 341/154
5,969,657 A * 10/1999 Dempsey et al. ........... 341/154

FOREIGN PATENT DOCUMENTS

| JP | A 11-145835 | | 5/1999 |
| JP | 411145835 A | * | 5/1999 |

* cited by examiner

*Primary Examiner*—Jean Jeanglaude
(74) *Attorney, Agent, or Firm*—Burns, Doane, Swecker & Mathis, LLP

(57) ABSTRACT

A ladder resistor includes a first resistor group including a number of resistors connected in series and generating a number of reference voltages, and a second resistor group including a same number of resistors connected in series as the plurality of resistors included in the first resistor group, and generating a number of reference voltages. The plurality of resistors included in the second resistor group corresponds to the plurality of resistors included in the first resistor group, respectively. Each of the plurality of resistors included in the first resistor group and a corresponding one of the plurality of resistors included in the second resistor group, that is, each resistor pair is symmetric with respect to a given point. The first resistor group is separated from the second resistor group so that they face each other with the point between.

10 Claims, 7 Drawing Sheets

US 6,710,730 B2

LADDER RESISTOR WITH REDUCED INTERFERENCE BETWEEN RESISTOR GROUPS

BACKGROUND OF THE INVENTION

1. Field of the Invention

The present invention relates to a ladder resistor built into either a successive approximation analog-to-digital converter or ADC or a digital-to-analog converter or DAC used to control a machine system such as a servo-controlled machine.

2. Description of the Prior Art

FIG. 6 is a schematic circuit diagram showing the structure of a prior art ladder resistor as disclosed in Japanese patent application publication (TOKKAIHEI) No. 11-145835. FIG. 7 is a block diagram showing the structure of a successive approximation ADC having a ladder resistor with 6-bit resolution as shown in FIG. 6.

In FIG. 6, reference numeral 110 denotes a normal resistor group including 64 resistors R0A to R63A connected in series, and reference numeral 120 denotes a reverse resistor group including the same number of resistors R0B to R63B connected in series as the plurality of resistors R0A to R63A included in the normal resistor group 110, the plurality of resistors R0B to R63B corresponding to the plurality of resistors R0A to R63A, respectively. The plurality of resistors R0A to R63A included in the normal resistor group 110 and the plurality of resistors R0B to R63B included in the reverse resistor group 120 are formed so that they have the same size. Each of the normal resistor group 110 and the reverse resistor group 120 divides the difference between two fixed voltages VRT and VRB applied thereto from outside the successive approximation ADC or generated in the ADC into 64 ($=2^6$) steps. Each of the normal resistor group 110 and the reverse resistor group 120 can thus generate and output 64 reference voltages by way of its 64 taps (i.e., 64 nodes).

In addition, the normal resistor group 110 is divided into four resistor sets each of which contains 16 resistors, as shown in FIG. 6. These four resistor sets are arranged so that they run in parallel with one another. Similarly, the reverse resistor group 120 is divided into four resistor sets each of which contains 16 resistors, as shown in FIG. 6. These four resistor sets are arranged so that they run in parallel with one another. Furthermore, the four resistor sets of the reverse resistor group 120 and the four resistor sets of the normal resistor group 110 are alternately aligned in the direction of X of FIG. 6.

In addition, each resistor included in the normal resistor group 110 and a corresponding resistor included in the reverse resistor group 120, that is, each resistor pair is arranged so that the two resistors included in each resistor pair are symmetric with respect to the center C of the layout of the ladder resistor. In other words, such the two resistors as R0A and R0B, R1A and R1B, . . . , or R63A and R63B included in each resistor pair are symmetric with respect to the center C of the layout of the ladder resistor.

Furthermore, in FIG. 6, reference numeral 130A denotes a first 16-to-1 selector for selecting one input terminal from a plurality of input terminals that are respectively connected to both a plurality of taps of the first resistor set (R0A to R15A) of the normal resistor group 110 and a plurality of taps of the first resistor set (R0B to R15B) of the reverse resistor group 120, and for furnishing a reference voltage which appears at the selected input terminal, reference numeral 130B denotes a second 16-to-1 selector for selecting one input terminal from a plurality of input terminals that are respectively connected to both a plurality of taps of the second resistor set (R16A to R31A) of the normal resistor group 110 and a plurality of taps of the second resistor set (R16B to R31B) of the reverse resistor group 120, and for furnishing a reference voltage which appears at the selected input terminal, reference numeral 130C denotes a third 16-to-1 selector for selecting one input terminal from a plurality of input terminals that are respectively connected to both a plurality of taps of the third resistor set (R32A to R47A) of the normal resistor group 110 and a plurality of taps of the third resistor set (R32B to R47B) of the reverse resistor group 120, and for furnishing a reference voltage which appears at the selected input terminal, reference numeral 130D denotes a fourth 16-to-1 selector for selecting one input terminal from a plurality of input terminals that are respectively connected to both a plurality of taps of the fourth resistor set (R48A to R63A) of the normal resistor group 110 and a plurality of taps of the fourth resistor set (R48B to R63B) of the reverse resistor group 120, and for furnishing a reference voltage which appears at the selected input terminal, and reference numeral 140 denotes a 4-to-1 selector for selecting one output from the outputs of the first through fourth 16-to-1 selectors 130A to 130D. The first through fourth 16-to-1 selectors 130A to 130D and the 4-to-1 selector 140 are controlled by a latch/control circuit 700 shown in FIG. 7.

In FIG. 7, reference numeral 300 denotes a sample and holding circuit (abbreviated as S/H from here on) for holding an analog voltage applied thereto by way of an analog input terminal 200 while a 1-bit comparator 600 compares the analog voltage with a threshold voltage, and reference numeral 400 denotes a DAC that is controlled by the latch/control circuit 700, and that delivers a reference voltage from the ladder resistor 100 or a voltage generated based on the reference voltage to a subtracter 500 as a voltage to be compared. The 1-bit comparator 600 determines whether or not the subtraction result from the subtracter 500 is 0 or more, and then outputs "1" if the subtraction result is 0 or more, and outputs "0" otherwise. The subtracter 500 subtracts the voltage to be compared from the DAC 400 from the analog voltage output from the S/H 300, and then outputs the subtraction result to the 1-bit comparator 600. The latch/control circuit 700 latches the output of the 1-bit comparator 600, and delivers a control signal for determining the voltage to be compared that should be output next by the DAC 400 based on the output of the 1-bit comparator 600 to the DAC 400, and then furnishes an A/D conversion result to outside the successive approximation ADC by way of an output terminal 800.

In operation, the ladder resistor 100 divides the difference between two fixed voltages VRT and VRB applied thereto from outside the successive approximation ADC or generated in the ADC into 64($=2^6$) steps. The ladder resistor 100 can thus generate 64 reference voltages, and select one of them and output the selected reference voltage to the DAC 400. Each of the first through fourth 16-to-1 selectors 130A to 130D is controlled by the control signal from the latch/control circuit 700 as shown in FIG. 7. Each of the first through fourth 16-to-1 selectors selects one reference voltage from 16 reference voltages generated by the corresponding resistor set and outputs the selected reference voltage. The 4-to-1 selector 140 is similarly controlled by the control signal from the latch/control circuit 700, and selects one reference voltage from four reference voltages selected by the first through fourth 16-to-1 selectors 130A to 130D and outputs the selected reference voltage to the DAC 400. The ladder resistor 100 thus outputs one reference voltage selected by the latch/control circuit 700 to the DAC 400.

On the other hand, the S/H 300 is holding an analog voltage applied thereto by way of the analog input terminal 200 while the 1-bit comparator 600 compares the analog voltage with a threshold voltage. The DAC is controlled by the latch/control circuit 700, and delivers a reference voltage from the ladder resistor 100 or a voltage generated based on the reference voltage to the subtracter 500 as a voltage to be compared. The subtracter 500 subtracts the voltage to be compared from the DAC 400 from the analog voltage output from the S/H 300, and then outputs the subtraction result to the 1-bit comparator 600.

The 1-bit comparator 600 determines whether or not the subtraction result from the subtracter 500 is 0 or more, and then outputs "1" if the subtraction result is 0 or more, and outputs "0" otherwise. The latch/control circuit 700 latches the output of the 1-bit comparator 600, and delivers a control signal for determining the voltage to be compared that should be output next by the DAC 400 based on the output of the 1-bit comparator 600 to the DAC 400. After repeating such processing, the 1-bit comparator 600 obtains and furnishes an A/D conversion result to outside the successive approximation ADC by way of the output terminal 800. This exemplary ADC selects one reference voltage from among the plurality of reference voltages generated by the ladder resistor, and employs a 1-bit comparator. As an alternative, the ADC can be so constructed as to select two or more reference voltages from among the plurality of reference voltages generated by the ladder resistor and provide the same advantage.

The ladder resistor 100 as shown in FIG. 6 is generally formed on a semiconductor substrate. The plurality of resistors R0A to R63A included in the normal resistor group and the plurality of resistors R0B to R63B included in the reverse resistor group are so formed on a semiconductor substrate as to have the same resistance according to a given manufacturing process, and those resistors in each resistor group are connected in series with aluminum wiring, so that the ladder resistor 100 is formed on the semiconductor substrate. It is desirable that the plurality of resistors formed in the ladder resistor have the same resistance. Actually, the resistances of the plurality of resistors are not completely identical with one another because of a variation in the parameters for the manufacturing process, such as the impurity concentration etc. (this phenomenon is referred to as mismatch from here on). The semiconductor chip is bonded to a die pad using resin or the like. Distortions due to stresses caused by bonding can thus cause the uniformity in the resistances of the plurality of resistors included in the ladder resistor. In addition, mismatch is also caused by stresses due to heat because the die pad, resin, and chip that constitute the semiconductor chip are made of different materials having different coefficients of thermal expansion, respectively. In general, either a dummy resistor or a dummy pattern to reduce such a mismatch is disposed in the ladder resistor.

The ladder resistor 100 as shown in FIG. 6 is expected to solve the problem that arises in the prior art. By counterbalancing the influence of distortions due to stresses in the direction of X and the influence of distortions due to stresses in the direction of Y on the resistances of the plurality of resistors that constitute the ladder resistor, the ladder resistor generates a plurality of reference voltages having a theoretical value or a value close to the theoretical value.

A problem with the prior art ladder resistor constructed as above is that since wiring for the normal resistor group 110 and wiring for the reverse resistor group 120 cross each other at many points, for example, wiring for connecting the taps of the reverse resistor group 120 to the first through fourth 16-to-1 selectors and wiring for connecting resistors included in the normal resistor group 110 to each other cross each other, as shown in FIG. 6, and those pieces of wiring interfere with each other, the plurality of reference voltages cannot be generated with a high degree of accuracy.

Furthermore, in the prior art ladder resistor constructed as shown in FIG. 6, the normal resistor group 110 and the reverse resistor group 120 are both divided into an even number of resistor sets, respectively. When an analog voltage whose value changes continuously such that its equivalent digital value changes at most bits when incremented by 1, e.g., an analog voltage having an equivalent digital value that varies from 1 Fh to 20 h is input to the successive approximation ADC, since the 32nd tap corresponding to 1 Fh and the 33rd tap corresponding to 20 h are included in different resistor sets, respectively, and therefore wiring 150 shown in FIG. 6 to connect these different resistor sets to each other is longer than wiring to connect resistors included in each resistor set to each other, the reference voltage that appears at the 33rd tap of the ladder resistor deviates from its theoretical value due to a parasitic resistance in the wiring to connect the different resistor sets to each other. In other words, in the prior art ladder resistor constructed as shown in FIG. 6, when an analog voltage having a corresponding A/D conversion result that varies at most bits thereof when incremented by 1 is input to the ADC, there causes distortions in the A/D conversion result because a corresponding reference voltage generated deviates from its theoretical value due to a parasitic resistance in the wiring to connect different resistor sets to each other.

SUMMARY OF THE INVENTION

The present invention is proposed to solve the above-mentioned problems, and it is therefore an object of the present invention to provide a ladder resistor capable of preventing wiring associated with a normal resistor group included therein and wiring associated with a reverse resistor group included therein from interfering with each other, and generating a plurality of reference voltages with a high degree of accuracy.

It is another object of the present invention to provide a ladder resistor capable of generating a plurality of reference voltages with a high degree of accuracy even when an analog voltage having a corresponding A/D conversion result that varies at most bits thereof when incremented by 1 is input to a successive approximation ADC or the like into which the ladder resistor is incorporated.

In accordance with an aspect of the present invention, there is provided a ladder resistor for generating a plurality of reference voltages, and for selecting and outputting one or more desired reference voltage from among the plurality of reference voltages, the ladder resistor comprising: a first resistor group including a number of resistors connected in series and generating a number of reference voltages; and a second resistor group including a same number of resistors connected in series as the plurality of resistors included in the first resistor group, and generating a number of reference voltages, the plurality of resistors included in the second resistor group corresponding to the plurality of resistors included in the first resistor group, respectively, each of the plurality of resistors included in the first resistor group and a corresponding one of the plurality of resistors included in the second resistor group, that is, each resistor pair being symmetric with respect to a given point, and the first resistor group being separated from the second resistor group so that they face each other with the point between.

In accordance with a preferred embodiment of the present invention, the ladder resistor further comprises a reference voltage selection unit for selecting one tap from among a plurality of taps disposed in the first resistor group and selecting a corresponding tap from among a plurality of taps disposed in the second resistor group, and for, after that, electrically connecting the selected tap of the first resistor group to the selected tap of the second resistor group so as to selectively output one of the plurality of reference voltages generated. Preferably, the reference voltage selection unit includes a first selector for selecting one tap from among the plurality of taps disposed in the first resistor group, and a second selector for selecting a corresponding tap from among the plurality of taps disposed in the second resistor group, and the first and second selectors are symmetric with respect to the given point.

In accordance with another preferred embodiment of the present invention, the ladder resistor further comprises a first constant voltage supply unit for supplying a first constant voltage to one end of the first resistor group, a second constant voltage supply unit for supplying a second constant voltage to another end of the first resistor group, a third constant voltage supply unit for supplying the first constant voltage to one end of the second resistor group, and a fourth constant voltage supply unit for supplying the second constant voltage to another end of the second resistor group, wherein the first and third constant voltage supply units are symmetric with respect to the given point and the second and fourth constant voltage supply units are symmetric with respect to the given point.

In accordance with another preferred embodiment of the present invention, the plurality of resistors included in each of the first and second resistor groups are divided into an odd number of resistor sets arranged in parallel with one another, and each of the first and second resistor groups is provided with at least one dummy resistor connected in series to the plurality of resistors included in each of the first and second resistor groups so that each of the odd number of resistor sets has an identical number of resistors.

Further objects and advantages of the present invention will be apparent from the following description of the preferred embodiments of the invention as illustrated in the accompanying drawings.

DETAILED DESCRIPTION OF THE PREFERRED EMBODIMENTS

Embodiment 1.

Figure 1:
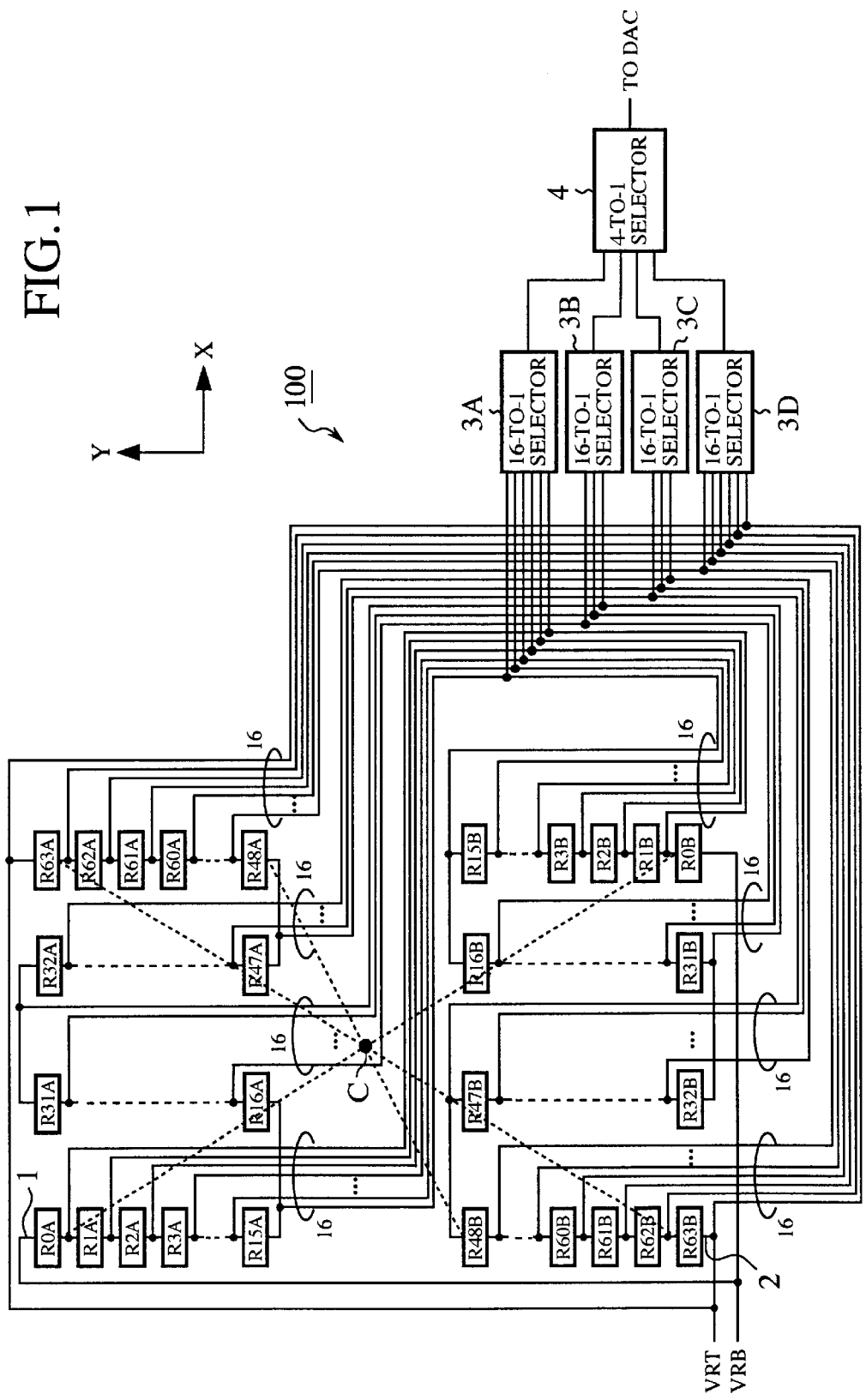
FIG. 1 is a schematic circuit diagram showing the structure of a ladder resistor according to a first embodiment of the present invention.
Figure 7:
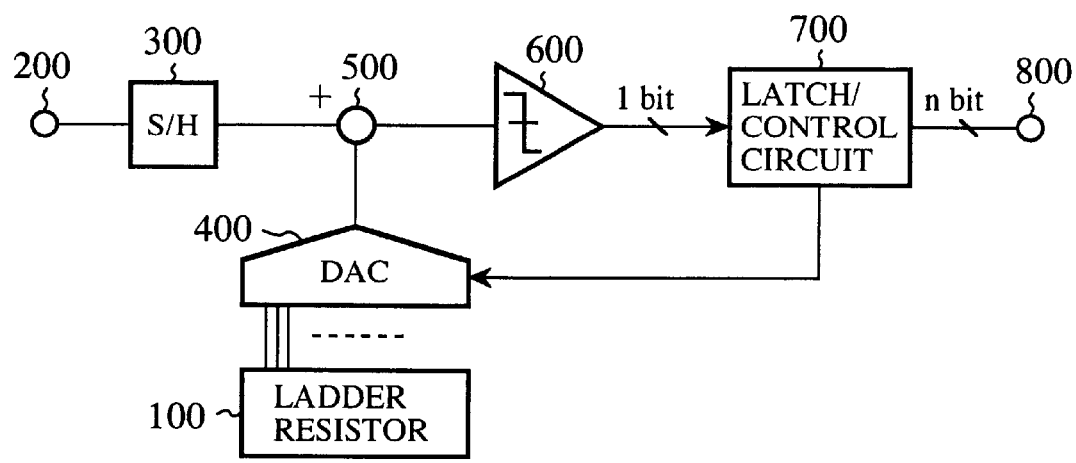
FIG. 7 is a block diagram showing the structure of a successive approximation ADC.

FIG. 1 is a schematic circuit diagram showing the structure of a ladder resistor according to a first embodiment of the present invention. In the figure, reference numeral 1 denotes a normal resistor group including 64 resistors R0A to R63A connected in series, and numeral 2 denotes a reverse resistor group including the same number of resistors R0B to R63B connected in series as the plurality of resistors R0A to R63A included in the normal resistor group 1, the plurality of resistors R0B to R63B included in the reverse resistor group 2 corresponding to the plurality of resistors R0A to R63A included in the normal resistor group 1, respectively. The ladder resistor 100 illustrated in FIG. 1 is a one having 6-bit resolution. However, the first embodiment of the present invention is not limited to the example shown in FIG. 1. Furthermore, the ladder resistor 100 according to the first embodiment can be applied to either successive approximation ADCs as shown in FIG. 7 or DACs.

In addition, the normal resistor group 1 is divided into four resistor sets each of which contains 16 resistors. These four resistor sets are arranged so that they run in parallel with one another. Similarly, the reverse resistor group 2 is divided into four resistor sets each of which contains 16 resistors, and these four resistor sets are arranged so that they run in parallel with one another. As shown in FIG. 1, the normal resistor group 1 and the reverse resistor group 2 are arranged so that they are separated from each other with respect to the direction of Y of FIG. 1 and therefore there is a certain distance between them. In other words, the four resistor sets of the normal resistor group 1 and the four resistor sets of the reverse resistor group 2 are not alternatively aligned at the same location with respect to the direction of Y and they are separated from each other, unlike the prior art ladder resistor shown in FIG. 6. As a result, wiring for the normal resistor group 1 and wiring for the reverse resistor group 2 do not cross each other at any point.

Each resistor included in the normal resistor group 1 and a corresponding resistor included in the reverse resistor group 2, that is, each resistor pair is arranged so that the two resistors included in each resistor pair are symmetric with respect to the center C of the layout of the ladder resistor. In other words, such the two resistors as R0A and R0B, R1A and R1B, . . . , or R63A and R63B included in each resistor pair are symmetric with respect to the center C of the layout of the ladder resistor.

Thus, the normal resistor group 1 and the reverse resistor group 2 included in the ladder resistor 100 according to the first embodiment share the common centroid C, that is, they have a common-centroid arrangement relationship, and the normal resistor group 1 and the reverse resistor group 2 are arranged so that they are separated from each other with respect to the direction of Y. In other words, the normal resistor group 1 and the reverse resistor group 2 are separated so that they face each other with the center C of the layout between.

Furthermore, in FIG. 1, reference numeral 3A denotes a first 16-to-1 selector for selecting one input terminal from among a plurality of input terminals thereof that are respectively connected to both a plurality of taps of the first resistor set (R0A to R15A) of the normal resistor group 1 and a plurality of taps of the first resistor set (R0B to R15B) of the reverse resistor group 2, and for furnishing a reference voltage which appears at the selected input terminal, reference numeral 3B denotes a second 16-to-1 selector for selecting one input terminal from among a plurality of input terminals thereof that are respectively connected to both a plurality of taps of the second resistor set (R16A to R31A) of the normal resistor group 1 and a plurality of taps of the second resistor set (R16B to R31B) of the reverse resistor group 2, and for furnishing a reference voltage which appears at the selected input terminal, reference numeral 3C denotes a third 16-to-1 selector for selecting one input terminal from among a plurality of input terminals thereof that are respectively connected to both a plurality of taps of the third resistor set (R32A to R47A) of the normal resistor group 1 and a plurality of taps of the third resistor set (R32B to R47B) of the reverse resistor group 2, and for furnishing a reference voltage which appears at the selected input terminal, reference numeral 3D denotes a fourth 16-to-1 selector for selecting one input terminal from among a plurality of input terminals thereof that are respectively connected to both a plurality of taps of the fourth resistor set (R48A to R63A) of the normal resistor group 1 and a plurality of taps of the fourth resistor set (R48B to R63B) of the reverse resistor group 2, and for furnishing a reference voltage which appears at the selected input terminal, and numeral 4 denotes a 4-to-1 selector for selecting one output from the outputs of the first through fourth 16-to-1 selectors 3A to 3D. In FIG. 1, a well-known dummy resistor or a well-known dummy pattern to reduce the mismatch is not shown.

In the following, a case where the ladder resistor 100 of the first embodiment is applied to the successive approximation ADC shown in FIG. 7 will be explained.

The ladder resistor 100 divides the difference between two constant voltages VRT and VRB applied thereto from outside the successive approximation ADC or generated in the ADC into 64(=$2^6$) steps. The ladder resistor 100 can thus generate 64 reference voltages, and select one of them and output the selected reference voltage to a DAC 400 as shown in FIG. 7. Each of the first through fourth 16-to-1 selectors 3A to 3D is controlled by a control signal from a latch/control circuit 700 as shown in FIG. 7. Each of the first through fourth 16-to-1 selectors selects one reference voltage from among 16 reference voltages generated by the corresponding resistor set and outputs the selected reference voltage. The 4-to-1 selector 4 is similarly controlled by the control signal from the latch/control circuit 700, and selects one reference voltage from among four reference voltages selected by the first through fourth 16-to-1 selectors 3A to 3D and outputs the selected reference voltage to the DAC 400. The ladder resistor 100 thus outputs one reference voltage selected by the latch/control circuit 700 to the DAC 400.

Figure 6:
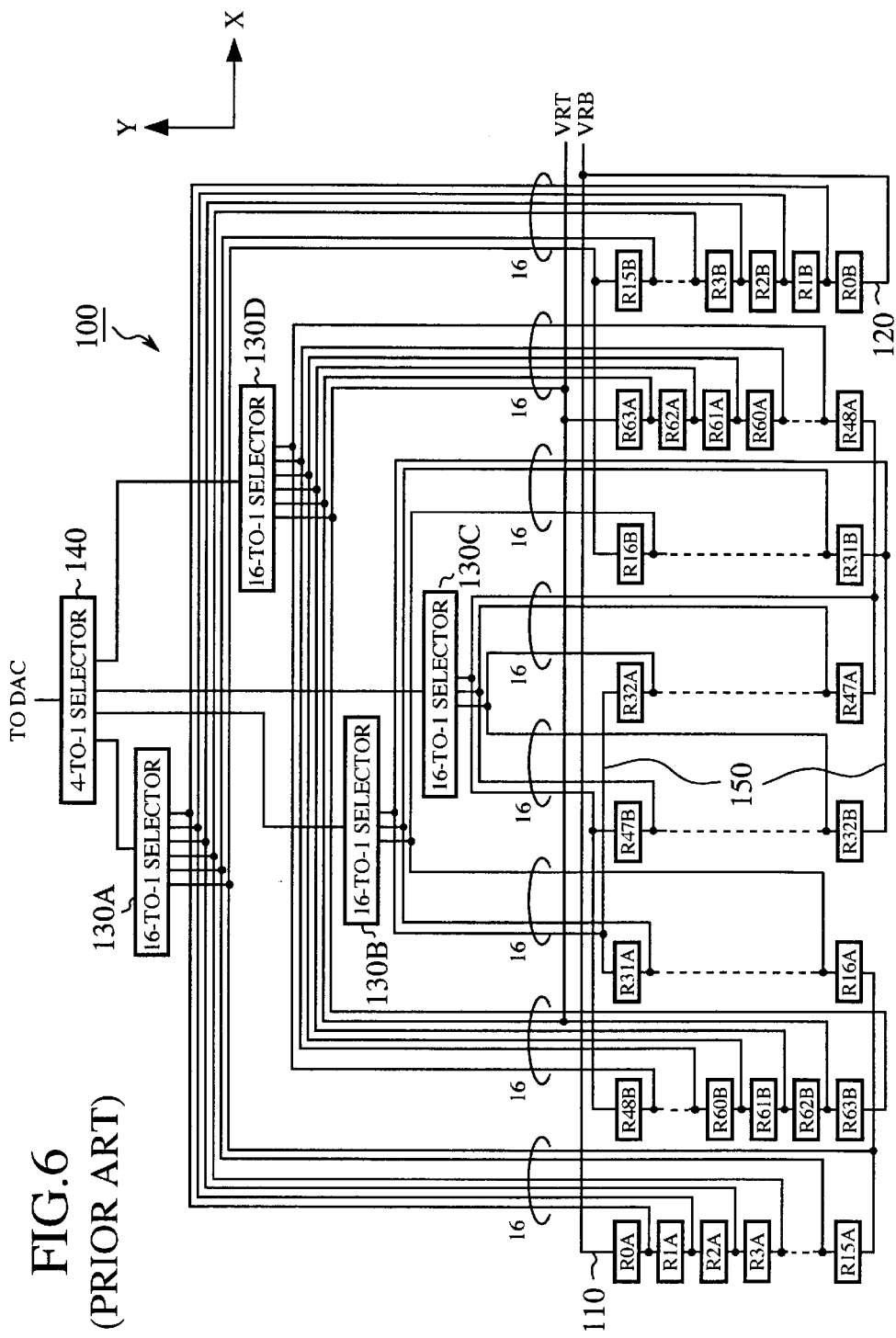
FIG. 6 is a schematic circuit diagram showing the structure of a prior art ladder resistor.

By the way, a problem with the prior art ladder resistor shown in FIG. 6 is that since wiring for the normal resistor group 110 and wiring for the reverse resistor group 120 cross each other at many points, for example, wiring for connecting the taps of the reverse resistor group 120 to the first through fourth 16-to-1 selectors and wiring for connecting resistors included in the normal resistor group 110 to each other cross each other, and those pieces of wiring interfere with each other, the plurality of reference voltages cannot be generated with a high degree of accuracy. In contrast, in the ladder resistor according to the first embodiment, the normal resistor group 1 has a common-centroid arrangement relationship with the reverse resistor group 2, as shown in FIG. 1. In addition, since the normal resistor group 1 and the reverse resistor group 2 are arranged so that they are separated from each other with respect to the direction of Y, wiring for the normal resistor group 1 and wiring for the reverse resistor group 2 do not cross each other at any point. Therefore, the ladder resistor 100 can generate the plurality of reference voltages with a high degree of accuracy.

As mentioned above, in accordance with the first embodiment of the present invention, since the normal resistor group 1 has a common-centroid arrangement relationship with the reverse resistor group 2, the influence of distortions due to stresses in the directions of X and Y on the resistances of the plurality of resistors that constitute the ladder resistor 100 can be reduced. Furthermore, since the normal resistor group 1 and the reverse resistor group 2 are arranged so that they are separated from each other with respect to the direction of Y of FIG. 1, the ladder resistor 100 can generate the plurality of reference voltages with a high degree of accuracy.

Embodiment 2.

Figure 2:
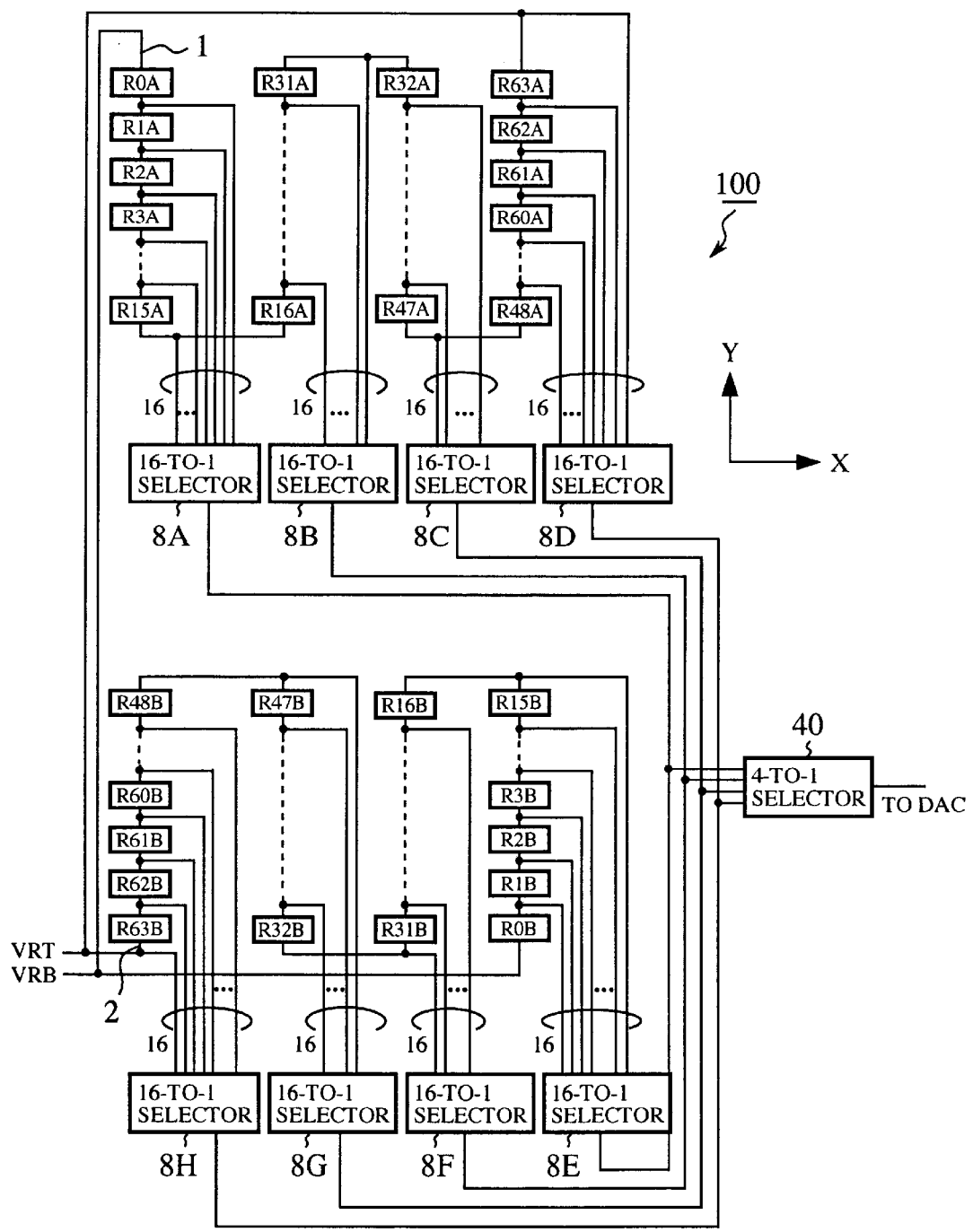
FIG. 2 is a schematic circuit diagram showing the structure of a ladder resistor according to a second embodiment of the present invention.

FIG. 2 is a schematic circuit diagram showing a ladder resistor according to a second embodiment of the present invention. In the figure, the same reference numerals as shown in FIG. 1 denote the same components as the ladder resistor according to the above-mentioned first embodiment, and therefore the description of the components will be omitted hereafter. The ladder resistor 100 illustrated in FIG. 2 is a one having 6-bit resolution. However, the second embodiment of the present invention is not limited to the example shown in FIG. 2. Furthermore, the ladder resistor 100 according to the second embodiment can be applied to either successive approximation ADCs as shown in FIG. 7 or DACs.

In FIG. 2, reference numeral 8A denotes a first 16-to-1 selector for selecting one tap from among a plurality of taps of a first resistor set (R0A to R15A) of a normal resistor group 1, and for furnishing a reference voltage which appears at the selected tap, reference numeral 8B denotes a second 16-to-1 selector for selecting one tap from among a plurality of taps of a second resistor set (R16A to R31A) of the normal resistor group 1, and for furnishing a reference voltage which appears at the selected tap, reference numeral 8C denotes a third 16-to-1 selector for selecting one tap from among a plurality of taps of a third resistor set (R32A to R47A) of the normal resistor group 1, and for furnishing a reference voltage which appears at the selected tap, reference numeral 8D denotes a fourth 16-to-1 selector for selecting one tap from among a plurality of taps of a fourth resistor set (R48A to R63A) of the normal resistor group 1, and for furnishing a reference voltage which appears at the selected tap, reference numeral 8E denotes a fifth 16-to-1 selector for selecting one tap from among a plurality of taps of a first resistor set (R0B to R15B) of a reverse resistor group 2, and for furnishing a reference voltage which appears at the selected tap, reference numeral 8F denotes a sixth 16-to-1 selector for selecting one tap from among a plurality of taps of a second resistor set (R16B to R31B) of the reverse resistor group 2, and for furnishing a reference voltage which appears at the selected tap, reference numeral 8G denotes a seventh 16-to-1 selector for selecting one tap from among a plurality of taps of a third resistor set (R32B to R47B) of the reverse resistor group 2, and for furnishing a reference voltage which appears at the selected tap, reference numeral 8H denotes an eighth 16-to-1 selector for selecting one tap from among a plurality of taps of a fourth resistor set (R48B to R63B) of the reverse resistor group 2, and for furnishing a reference voltage which appears at the selected tap, and numeral 40 denotes a 4-to-1 selector for selecting one input terminal from among four input terminals thereof connected to a connection point between the outputs of the first and fifth 16-to-1 selectors 8A and 8E, a connection point between the outputs of the second and sixth 16-to-1 selectors 8B and 8F, a connection point between the outputs of the third and seventh 16-to-1 selectors 8C and 8G, and a connection point between the outputs of the fourth and eighth 16-to-1 selectors 8D and 8H, respectively, and for furnishing a reference voltage which appears at the selected input terminal. In FIG. 2, a well-known dummy resistor or a well-known dummy pattern to reduce the mismatch is not shown.

In the ladder resistor 100 according to the above-mentioned first embodiment shown in FIG. 1, the tap of each resistor RXA of the normal resistor group 1 (X is an arbitrary integer from 0 to 63) is connected to the tap of a corresponding resistor RXB by wiring. Each connection point between the taps of each resistor pair is connected to one input terminal of a corresponding 16-to-1 selector. Accordingly, as shown in FIG. 1, long wiring is needed to connect between the taps of each resistor pair, and the wiring therefore becomes complex. As a result, a parasitic capacitance and a parasitic resistance in the wiring increase, and the characteristics of the ladder resistor 100 deteriorates.

In contrast, in the ladder resistor 100 according to the second embodiment shown in FIG. 2, the taps of each resistor pair are not connected directly to each other, but are connected to each other by way of one 16-to-1 selector for each tap. For example, the tap of the resistor R0A and the tap of the resistor R0B are connected to each other by way of the first 16-to-1 selector 8A and the fifth 16-to-1 selector 8E. A point connected between the outputs of the first and fifth 16-to-1 selectors 8A and 8E is further connected to one input terminal of the 4-to-1 selector 40. Therefore, the constitution as shown in FIG. 2 can reduce the length of wiring to connect the taps of each resistor pair of the ladder resistor 100 to each other, compared with the above-mentioned first embodiment shown in FIG. 1.

In the following, a case where the ladder resistor 100 of the second embodiment is applied to the successive approximation ADC shown in FIG. 7 will be explained.

The ladder resistor 100 divides the difference between two fixed voltages VRT and VRB applied thereto from outside the successive approximation ADC or generated in the ADC into 64(=$2^6$) steps. The ladder resistor 100 can thus generate 64 reference voltages, and select one of them and output the selected reference voltage to a DAC 400 as shown in FIG. 7. Each of the first through eighth 16-to-1 selectors 8A to 8H is controlled by a control signal from a latch/control circuit 700 as shown in FIG. 7. Each of the first through eighth 6-to-1 selectors selects one reference voltage from among 16 reference voltages generated by the corresponding resistor set and outputs the selected reference voltage. The 4-to-1 selector 40 is similarly controlled by the control signal from the latch/control circuit 700, and selects one input terminal from among the four input terminals thereof connected to the connection point between the outputs of the first and fifth 16-to-1 selectors 8A and 8E, the connection point between the outputs of the second and sixth 16-to-1 selectors 8B and 8F, the connection point between the outputs of the third and seventh 16-to-1 selectors 8C and 8G, and the connection point between the outputs of the fourth and eighth 16-to-1 selectors 8D and 8H, respectively. The 4-to-1 selector 40 then furnishes a reference voltage which appears at the selected input terminal. The ladder resistor 100 thus outputs one reference voltage selected by the latch/control circuit 700 to the DAC 400.

In the ladder resistor according to the second embodiment, the normal resistor group 1 has a common-centroid arrangement relationship with the reverse resistor group 2, as shown in FIG. 2. In addition, since the normal resistor group 1 and the reverse resistor group 2 are arranged so that they are separated from each other with respect to the direction of Y, wiring for the normal resistor group 1 and wiring for the reverse resistor group 2 do not cross each other at any point. Therefore, the ladder resistor 100 can generate the plurality of reference voltages with a high degree of accuracy.

In addition, since the taps of each resistor pair are not directly connected to each other, but are connected to each other by way of one 16-to-1 selector for each tap, it is possible to shorten the length of the wiring to connect the taps of each resistor pair of the ladder resistor 100 to each other, and simplify the layout of the wiring, compared with the above-mentioned first embodiment, thus decreasing the parasitic resistance and parasitic capacitance of the wiring and therefore further improving the characteristics of the ladder resistor 100.

As mentioned above, in accordance with the second embodiment of the present invention, since the normal resistor group 1 has a common-centroid arrangement relationship with the reverse resistor group 2, and the normal resistor group 1 and the reverse resistor group 2 are arranged so that they are separated from each other with respect to the direction of Y of FIG. 2, the ladder resistor 100 can generate the plurality of reference voltages with a high degree of accuracy. In addition, since the taps of each resistor pair are connected to each other by way of one 16-to-1 selector for each tap, it is possible to shorten the length of the wiring to connect the taps of each resistor pair of the ladder resistor 100 to each other, and simplify the layout of the wiring, thus decreasing the parasitic resistance and parasitic capacitance of the wiring and therefore further improving the characteristics of the ladder resistor 100.

The taps of each resistor pair of the ladder resistor 100 can be connected to each other by way of two or more 16-to-1 selectors for each tap. In this case, the same advantage is provided.

Embodiment 3.

Figure 3:
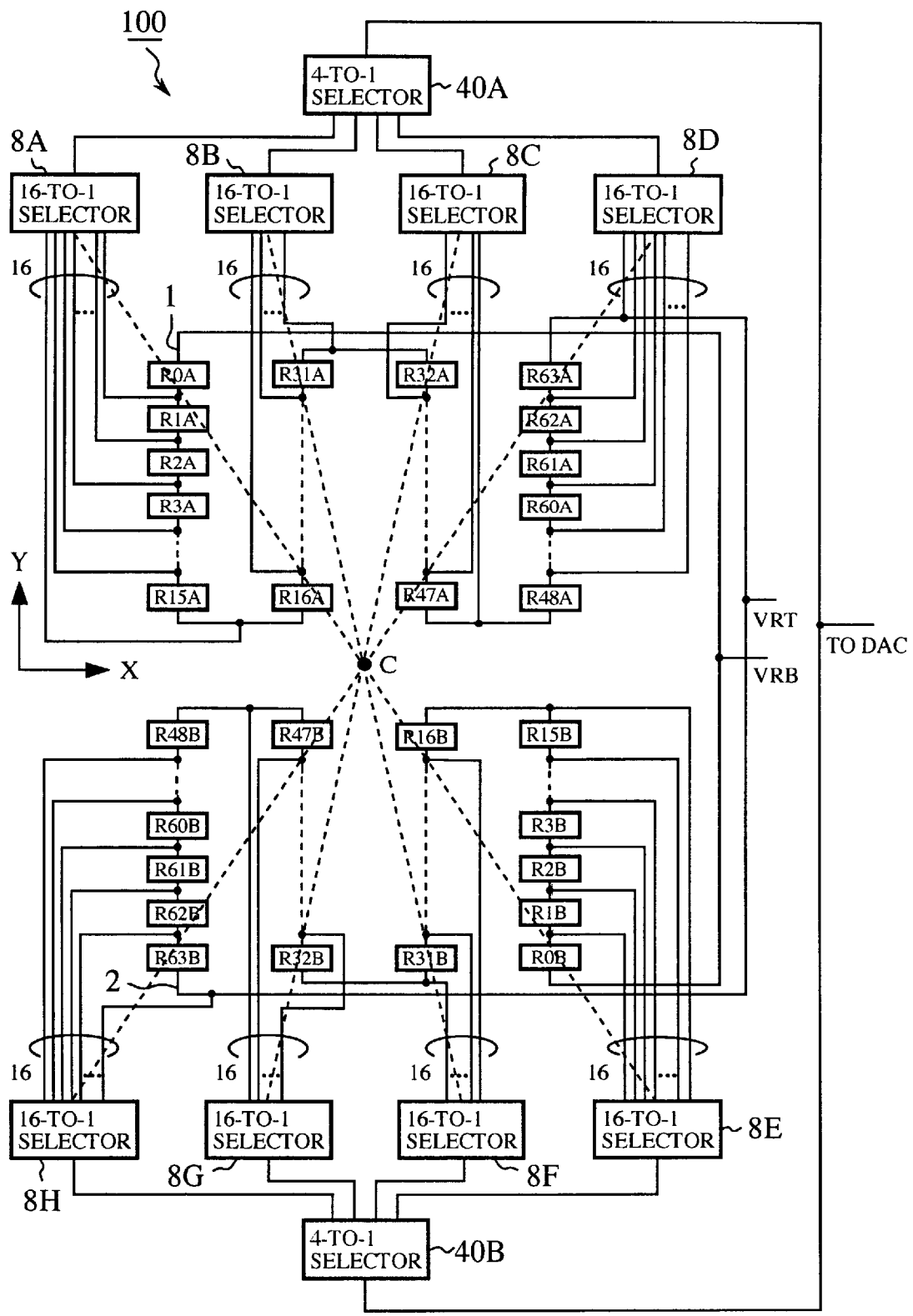
FIG. 3 is a schematic circuit diagram showing the structure of a ladder resistor according to a third embodiment of the present invention.

FIG. 3 is a schematic circuit diagram showing a ladder resistor according to a third embodiment of the present invention. In the figure, the same reference numerals as shown in FIG. 2 denote the same components as the ladder resistor according to the above-mentioned second embodiment, and therefore the description of the components will be omitted hereafter. The ladder resistor 100 illustrated in FIG. 3 is a one having 6-bit resolution. However, the third embodiment of the present invention is not limited to the example shown in FIG. 3. Furthermore, the ladder resistor 100 according to the third embodiment can be applied to either successive approximation ADCs as shown in FIG. 7 or DACs.

In FIG. 3, reference numeral 40A denotes a first 4-to-1 selector for selecting one input terminal from among four input terminals thereof connected to the output terminals of first through fourth 16-to-1 selectors 8A to 8D, and for furnishing a reference voltage which appears at the selected input terminal, and reference numeral 40B denotes a second 4-to-1 selector for selecting one input terminal from among four input terminals thereof connected to the output terminals of fifth through eighth 16-to-1 selectors 8E to 8H, and for furnishing a reference voltage which appears at the selected input terminal. In FIG. 3, a well-known dummy resistor or a well-known dummy pattern to reduce the mismatch is not shown.

In the ladder resistor 100 according to the above-mentioned second embodiment shown in FIG. 2, the taps of each resistor pair are not directly connected to each other, but are connected to each other by way of one 16-to-1 selector for each tap. Therefore, it is possible to shorten the length of the wiring to connect the taps of each resistor pair of the ladder resistor 100 to each other, and simplify the layout of the wiring. However, the length of wiring to connect the tap of one resistor RXA of each resistor pair (X is an arbitrary integer of 0–63) to a corresponding 16-to-1 selector differs from that of wiring to connect the tap of the other resistor RXB of each resistor pair to a corresponding 16-to-1 selector. In addition, the length of wiring to connect the tap of one resistor RXA of each resistor pair to the 4-to-1 selector differs from that of wiring to connect the tap of the other resistor RXB of each resistor pair to the 4-to-1 selector. In other words, the wiring for one of the two taps of each resistor pair has a parasitic resistance and a parasitic capacitance respectively different from those of the wiring for the other one of the two taps of each resistor pair, and therefore the wiring from the output terminal of the ladder resistor 100 to one of the two taps of each resistor pair has electric characteristics different from those of the wiring from the output terminal of the ladder resistor 100 to the other one of the two taps of each resistor pair.

In contrast, in the ladder resistor 100 according to the third embodiment shown in FIG. 3, the first through fourth 16-to-1 selectors 8A to 8D associated with the normal resistor group 1 are placed on the other side of the normal resistor group 1 from the center C of the layout so that they are arranged in the same direction in which the plurality of resistor sets included in the normal resistor group 1 are aligned, and the first through fourth 16-to-1 selectors are parallel to the plurality of resistor sets. Similarly, the fifth through eighth 16-to-1 selectors 8E to 8H associated with the reverse resistor group 2 are placed on the other side of the reverse resistor group 2 from the center C of the layout so that they are arranged in the same direction in which the plurality of resistor sets included in the reverse resistor group 2 are aligned, and the fifth through eighth 16-to-1 selectors are parallel to the plurality of resistor sets. In addition, as shown in FIG. 3, the first 4-to-1 selector 40A is arranged next to the first through fourth 16-to-1 selectors 8A to 8D arranged in a line, and the second 4-to-1 selector 40B is arranged next to the fourth through eighth 16-to-1 selectors 8E to 8H arranged in a line.

Furthermore, the first 16-to-1 selector 8A and the fifth 16-to-1 selector 8E are symmetric with respect to the center C of the layout. Similarly, the second 16-to-1 selector 8B and the sixth 16-to-1 selector 8F are symmetric with respect to the center C of the layout, the third 16-to-1 selector 8C and the seventh 16-to-1 selector 8G are symmetric with respect to the center C of the layout, the fourth 16-to-1 selector 8D and the eighth 16-to-1 selector 8H are symmetric with respect to the center C of the layout, and the first 4-to-1 selector 40A and the second 4-to-1 selector 40B are symmetric with respect to the center C of the layout. In addition, the output terminal of the first 4-to-1 selector 40A is connected to the output terminal of the second 4-to-1 selector 40B so that two pieces of wiring to connect them to each other are symmetric with respect to the center C of the layout.

In other words, each of the first through fourth 16-to-1 selectors 8A to 8D has a common-centroid arrangement relationship with a corresponding one of the sixth through eighth 16-to-1 selectors 8E to 8H. Wiring to connect between each of the first through fourth 16-to-1 selectors 8A to 8D and each of the corresponding plurality of taps of the normal resistor group 1 has a common-centroid arrangement relationship with wiring to connect between each of the fifth through eighth 16-to-1 selectors 8E to 8H and each of the corresponding plurality of taps of the reverse resistor group 2. Similarly, the first 4-to-1 selector 40A has a common-centroid arrangement relationship with the second 4-to-1 selector 40B. Wiring to connect between each of the first through fourth 16-to-1 selectors 8A to 8D and the first 4-to-1 selector 40A has a common-centroid arrangement relationship with wiring to connect between each of the fifth through eighth 16-to-1 selectors 8E to 8H and the second 4-to-1 selector 40B.

As a result, the length of wiring to connect the tap of one resistor of each resistor pair to the output terminal of the ladder resistor 100 by way of one 16-to-1 selector and one 4-to-1 selector can be made to be equal to that of wiring to connect the tap of the other resistor of each resistor pair to the output terminal of the ladder resistor 100 by way of one 16-to-1 selector and one 4-to-1 selector. Therefore, the wiring from the output terminal of the ladder resistor 100 to one of the two taps of each resistor pair can have the same electric characteristics as the wiring from the output terminal of the ladder resistor 100 to the other one of the two taps of each resistor pair.

Since the basic operation of the ladder resistor according to the third embodiment is the same as that of the ladder resistor according to the above-mentioned second embodiment, the explanation of the operation will be omitted hereafter.

As mentioned above, in accordance with the third embodiment of the present invention, since the normal resistor group 1 has a common-centroid arrangement relationship with the reverse resistor group 2, and the normal resistor group 1 and the reverse resistor group 2 are arranged so that they are separated from each other with respect to the direction of Y of FIG. 3, the ladder resistor 100 can generate the plurality of reference voltages with a high degree of accuracy. In addition, since the group of selectors associated with the normal resistor group 1 has a common-centroid arrangement relationship with the group of selectors associated with the reverse resistor group 2, the length of the wiring to connect the tap of one resistor of each resistor pair to the output terminal of the ladder resistor 100 by way of one 16-to-1 selector and one 4-to-1 selector can be made to be equal to that of the wiring to connect the tap of the other resistor of each resistor pair to the output terminal of the ladder resistor 100 by way of one 16-to-1 selector and one 4-to-1 selector. Therefore, the electric characteristics of the ladder resistor 100 can be further improved, compared with the above-mentioned second embodiment.

The length of the wiring to connect the tap of one resistor of each resistor pair to the output terminal of the ladder resistor 100 by way of one 16-to-1 selector and one 4-to-1 selector does not need to be made to be completely equal to that of the wiring to connect the tap of the other resistor of each resistor pair to the output terminal of the ladder resistor 100 by way of one 16-to-1 selector and one 4-to-1 selector. Those wiring lengths only have to be equalized substantially. The same advantage can be provided even in this case.

Embodiment 4.

Figure 4:
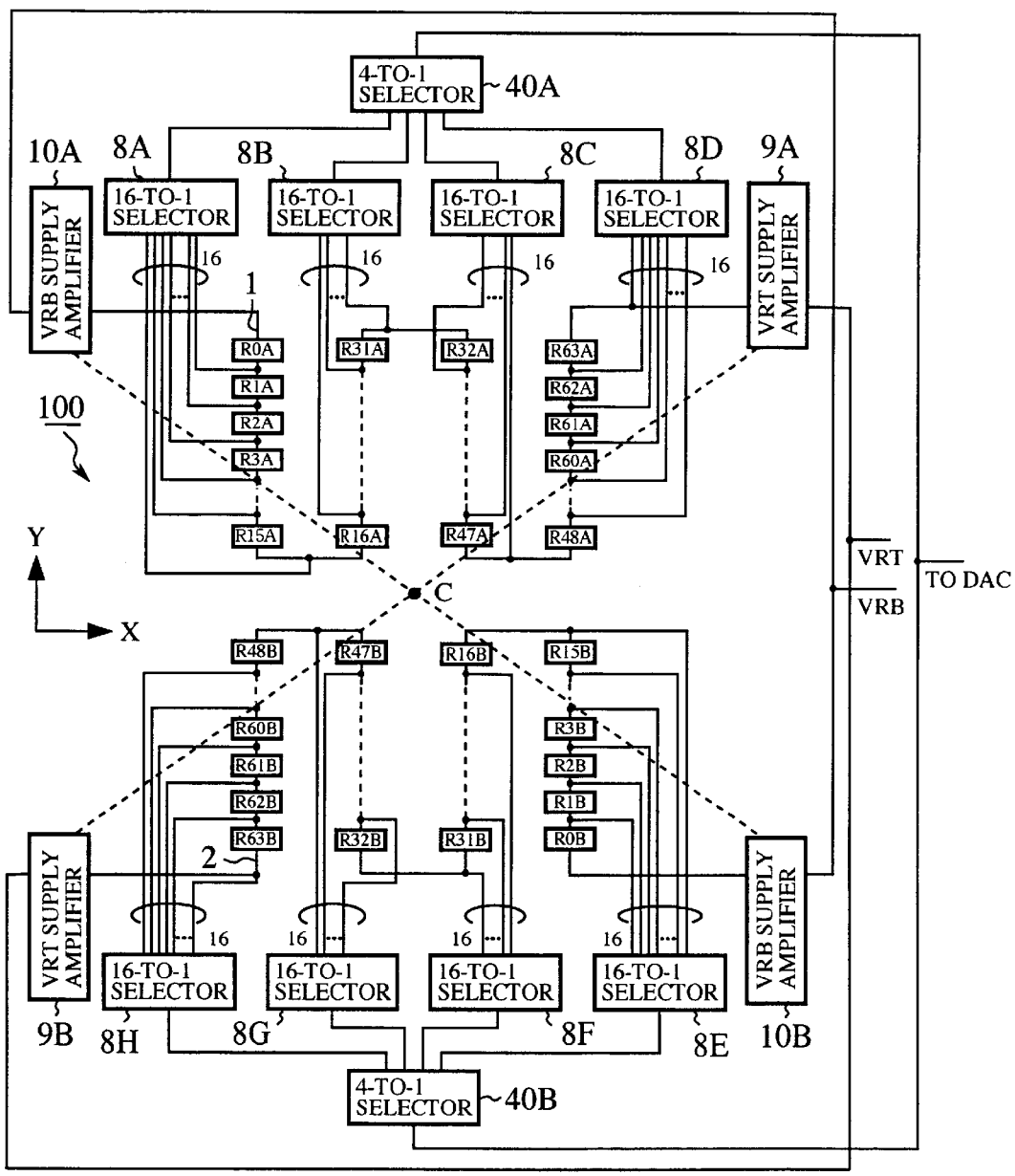
FIG. 4 is a schematic circuit diagram showing the structure of a ladder resistor according to a fourth embodiment of the present invention.

FIG. 4 is a schematic circuit diagram showing a ladder resistor according to a fourth embodiment of the present invention. In the figure, the same reference numerals as shown in FIG. 3 denote the same components as the ladder resistor according to the above-mentioned third embodiment, and therefore the description of the components will be omitted hereafter. The ladder resistor 100 illustrated in FIG. 4 is a one having 6-bit resolution. The fourth embodiment of the present invention is not limited to the example shown in FIG. 4. Furthermore, the ladder resistor 100 according to the fourth embodiment can be applied to either successive approximation ADCs as shown in FIG. 7 or DACs.

In FIG. 4, reference numeral 9A denotes a first VRT supply amplifier for supplying a constant voltage VRT to an end of a normal resistor group 1, reference numeral 9B denotes a second VRT supply amplifier for supplying the constant voltage VRT to an end of a reverse resistor group 2, reference numeral 10A denotes a first VRB supply amplifier for supplying a constant voltage VRB to another end of the normal resistor group 1, and reference numeral 10B denotes a second VRB supply amplifier for supplying the constant voltage VRB to another end of the reverse resistor group 2.

In the ladder resistor 100 according to the above-mentioned third embodiment shown in FIG. 3, the length of the wiring to connect the tap of one resistor of each resistor pair to the output terminal of the ladder resistor 100 by way of one 16-to-1 selector and one 4-to-1 selector can be made to be equal to that of the wiring to connect the tap of the other resistor of each resistor pair to the output terminal of the ladder resistor 100 by way of one 16-to-1 selector and one 4-to-1 selector. Therefore, the wiring from the output terminal of the ladder resistor 100 to one of the two taps of each resistor pair can have the same electric characteristics as the wiring from the output terminal of the ladder resistor 100 to the other one of the two taps of each resistor pair. However, the wiring from a source of the constant voltage VRT (not shown in FIG. 3) to the normal resistor group 1 does not have a common-centroid arrangement relationship with the wiring from the source of the constant voltage VRT to the reverse resistor group 2. Similarly, the wiring from a source of the other constant voltage VRB (not shown in FIG. 3) to the normal resistor group 1 does not have a common-centroid arrangement relationship with the wiring from the source of the other constant voltage VRB to the reverse resistor group 2. In other words, the length of the wiring from the source of the constant voltage VRT (not shown in FIG. 3) to the resistor R63A differs from that of the wiring from the source of the constant voltage VRT to the resistor R63B, and the length of the wiring from the source of the constant voltage VRB (not shown in FIG. 3) to the resistor R0A differs from that of the wiring from the source of the constant voltage VRB to the resistor R0B. As a result, there causes a slight difference between each of a number of reference voltages supplied from the normal resistor group 1 and each of a number of reference voltages supplied from the reverse resistor group 2.

In contrast, in the ladder resistor 100 according to the fourth embodiment shown in FIG. 4, the first VRT supply amplifier 9A and the second VRT supply amplifier 9B are symmetric with respect to the center C of the layout, and the first VRB supply amplifier 10A and the second VRB supply amplifier 10B are symmetric with respect to the center C of the layout. In other words, the first VRT supply amplifier 9A has a common-centroid arrangement relationship with the second VRT supply amplifier 9B, and the first VRB supply amplifier 10A has a common-centroid arrangement relationship with the second VRB supply amplifier 10B.

As a result, the length of the wiring from each of the sources of the constant voltages VRT and VRB, by way of the normal resistor group 1 and the group of selectors associated with the normal resistor group, to the output terminal of the ladder resistor 100 can be made to be equal to that of the wiring from a corresponding one of the sources of the constant voltages VRT and VRB, by way of the reverse resistor group 2 and the group of selectors associated with the reverse resistor group, to the output terminal of the ladder resistor 100. Therefore, the wiring from the output terminal of the ladder resistor 100, by way of one resistor of each resistor pair, to the source of the constant voltage VRT can have the same electric characteristics as the wiring from the output terminal of the ladder resistor 100, by way of the other resistor of each resistor pair, to the other source of the constant voltage VRT, and the wiring from the output terminal of the ladder resistor 100, by way of one resistor of each resistor pair, to the source of the other constant voltage VRB can have the same electric characteristics as the wiring from the output terminal of the ladder resistor 100, by way of the other resistor of each resistor pair, to the other source of the other constant voltage VRB.

Since the basic operation of the ladder resistor 100 according to the fourth embodiment is the same as that of the ladder resistor according to the above-mentioned third embodiment, the description of the operation will be omitted hereafter.

As mentioned above, in accordance with the fourth embodiment of the present invention, since the normal resistor group 1 has a common-centroid arrangement relationship with the reverse resistor group 2, and the normal resistor group 1 and the reverse resistor group 2 are arranged so that they are separated from each other with respect to the direction of Y of FIG. 4, the ladder resistor 100 can generate the plurality of reference voltages with a high degree of accuracy. In addition, since the group of selectors associated with the normal resistor group 1 has a common-centroid arrangement relationship with the group of selectors associated with the reverse resistor group 2, and each of the sources of the constant voltages VRT and VRB associated with the normal resistor group 1 have a common-centroid arrangement relationship with a corresponding one of the sources of the constant voltages VRT and VRB associated with the reverse resistor group 2, respectively, the length of the wiring from each of the sources of the constant voltages VRT and VRB, by way of the normal resistor group 1 and the group of selectors associated with the normal resistor group, to the output terminal of the ladder resistor 100 can be made to be equal to that of the wiring from a corresponding one of the sources of the constant voltages VRT and VRB, by way of the reverse resistor group 2 and the group of selectors associated with the reverse resistor group, to the output terminal of the ladder resistor 100. Therefore, the electric characteristics of the ladder resistor 100 can be further improved, compared with the above-mentioned third embodiment.

Embodiment 5.

Figure 5:
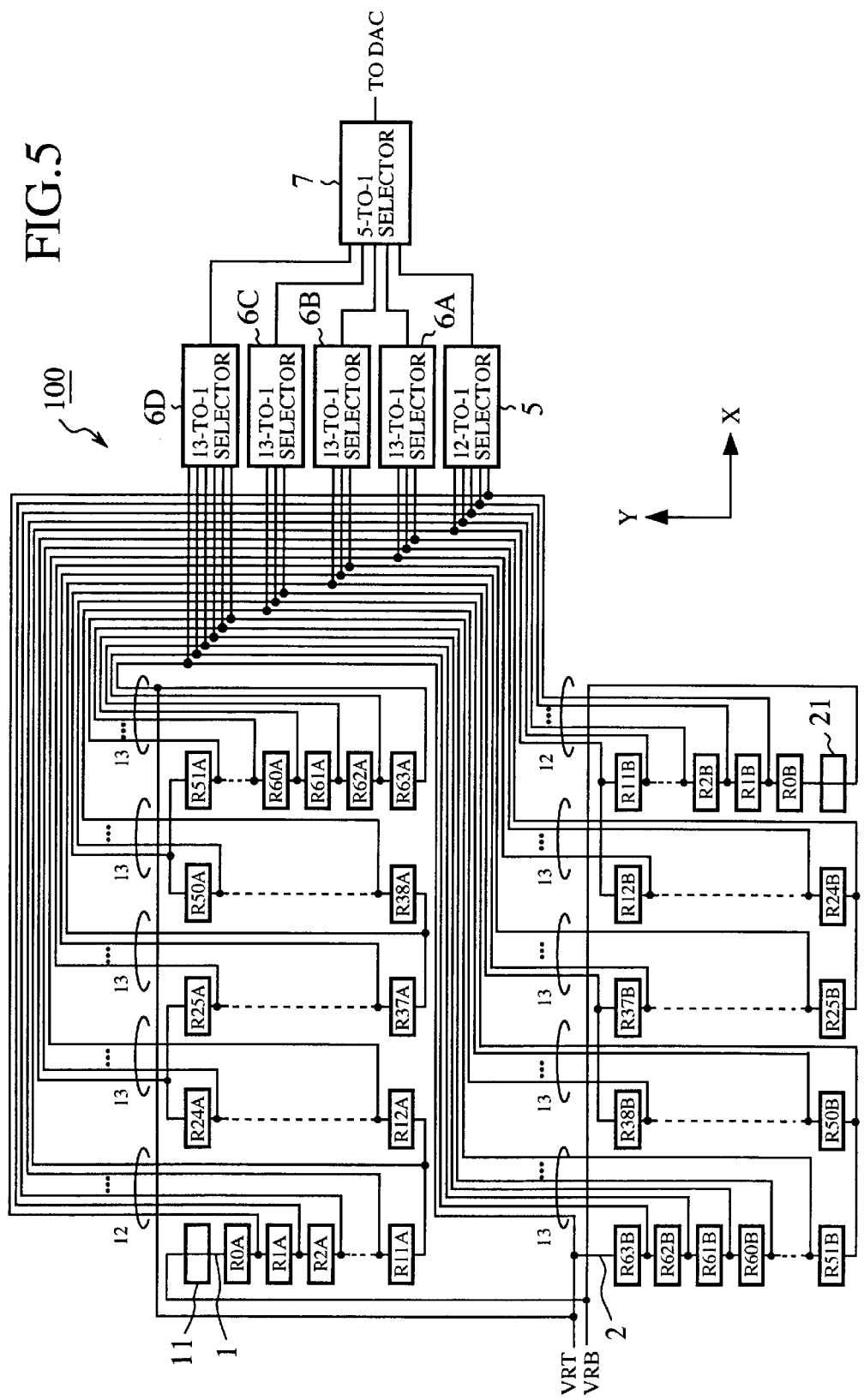
FIG. 5 is a schematic circuit diagram showing the structure of a ladder resistor according to a fifth embodiment of the present invention.

FIG. 5 is a schematic circuit diagram showing a ladder resistor according to a fifth embodiment of the present invention. In the figure, the same reference numerals as shown in FIG. 1 denote the same components as the ladder resistor according to the above-mentioned first embodiment, and therefore the description of the components will be omitted hereafter. The ladder resistor 100 illustrated in FIG. 5 is a one having 6-bit resolution. The fifth embodiment of the present invention is not limited to the example shown in FIG. 5. Furthermore, the ladder resistor 100 according to the fifth embodiment can be applied to either successive approximation ADCs as shown in FIG. 7 or DACs.

In FIG. 5, reference numeral 11 denotes a dummy resistor included in a normal resistor group 1, and connected in series between wiring used for supplying a constant voltage VRB to the normal resistor group and a resistor R0A of the normal resistor group, and reference numeral 21 denotes a dummy resistor included in a reverse resistor group 2, and connected in series between wiring used for supplying the constant voltage VRB to the reverse resistor group and a resistor R0B of the reverse resistor group. In FIG. 5, a well-known dummy resistor or a well-known dummy pattern to reduce the mismatch is not shown.

The ladder resistor 100 according to the fifth embodiment differs from that according to the above-mentioned first embodiment in that each of the normal resistor group 1 and the reverse resistor group 2 is divided into an odd number of resistor sets. In the example as shown in FIG. 5, each of the normal resistor group 1 and the reverse resistor group 2 is divided into 5 resistor sets, and each resistor set contains 13 resistors. The first resistor set of the normal resistor group 1 contains the dummy resistor 11 and twelve resistors R0A to R11A, and the first resistor set of the reverse resistor group 2 contains the dummy resistor 21 and twelve resistors R0B to R11B. When dividing each of the normal resistor group 1 and the reverse resistor group 2 into an odd number of resistor sets, the number of resistors originally included in each resistor set of each of the normal and reverse resistor groups 1 and 2 cannot be equalized, as shown in FIG. 5, and this results in no reduction in the influence of distortions due to stresses in the ladder resistor. To reduce the influence of distortions due to stresses in the ladder resistor, the dummy resistors 11 and 21 are added to the normal resistor group 1 and the reverse resistor group 2, respectively. The dummy resistor 11 can be alternatively connected in series between wiring used for supplying a constant voltage VRT to the normal resistor group and a resistor R63A of the normal resistor group. The dummy resistor 21 can be alternatively connected in series between wiring used for supplying the constant voltage VRT to the reverse resistor group and a resistor R63B of the reverse resistor group. As an alternative, dummy resistors can be connected to both ends of each of the normal resistor group 1 and the reverse resistor group 2 according to the division of each of the normal resistor group 1 and the reverse resistor group 2 into an odd number of resistor sets.

In FIG. 5, reference numeral 5 denotes a 12-to-1 selector for selecting one input terminal from among a plurality of input terminals thereof that are respectively connected to both a plurality of taps of the first resistor set (R0A to R11A) of the normal resistor group 1 and a plurality of taps of the first resistor set (R0B to R11B) of the reverse resistor group 2, and for furnishing a reference voltage which appears at the selected input terminal, reference numeral 6A denotes a first 13-to-1 selector for selecting one input terminal from among a plurality of input terminals thereof that are respectively connected to both a plurality of taps of the second resistor set (R12A to R24A) of the normal resistor group 1 and a plurality of taps of the second resistor set (R12B to R24B) of the reverse resistor group 2, and for furnishing a reference voltage which appears at the selected input terminal, reference numeral 6B denotes a second 13-to-1 selector for selecting one input terminal from among a plurality of input terminals thereof that are respectively connected to both a plurality of taps of the third resistor set (R25A to R37A) of the normal resistor group 1 and a plurality of taps of the third resistor set (R25B to R37B) of the reverse resistor group 2, and for furnishing a reference voltage which appears at the selected input terminal, reference numeral 6C denotes a third 13-to-1 selector for selecting one input terminal from among a plurality of input terminals thereof that are respectively connected to both a plurality of taps of the fourth resistor set (R38A to R50A) of the normal resistor group 1 and a plurality of taps of the fourth resistor set (R38B to R50B) of the reverse resistor group 2, and for furnishing a reference voltage which appears at the selected input terminal, reference numeral 6D denotes a fourth 13-to-1 selector for selecting one input terminal from among a plurality of input terminals thereof that are respectively connected to both a plurality of taps of the fifth resistor set (R51A to R63A) of the normal resistor group 1 and a plurality of taps of the fifth resistor set (R51B to R63B) of the reverse resistor group 2, and for furnishing a reference voltage which appears at the selected input terminal, and numeral 7 denotes a 5-to-1 selector for selecting one output from among the outputs of the 12-to-1 selector 5 and the first through fourth 13-to-1 selectors 6A to 6D.

By the way, as previously mentioned, in the ladder resistor 100 according to the above-mentioned first embodiment constructed as shown in FIG. 1, each of the normal resistor group 1 and the reverse resistor group 2 is divided into an even number of resistor sets. When an analog voltage having a value that changes continuously such that its equivalent digital value changes at most bits thereof when incremented by 1, e.g., an analog voltage having an equivalent digital value that will change from 1 Fh to 20 h is input to the successive approximation ADC, since the 32nd tap corresponding to 1 Fh and the 33rd tap corresponding to 20 h are included in different resistor sets, respectively, and therefore the wiring to connect these different resistor sets to each other is longer than the wiring to connect resistors included in each resistor set to each other, the reference voltage that appears at the 33rd tap of the ladder resistor 100 deviates from its theoretical value due to a parasitic resistance in the wiring to connect the different resistor sets to each other and this results in distortions in A/D conversion results into which an input analog voltage that changes continuously is converted.

In other words, in the above-mentioned first embodiment, since all of taps corresponding to reference voltages which correspond to A/D conversion results that will change at most bits thereof when incremented by 1 are even-numbered taps, the division of each of the normal resistor group 1 and the reverse resistor group 2 into an even number of resistors causes distortions in A/D conversion results into which an input analog voltage that changes continuously is converted because of a parasitic resistance in the wiring to connect different resistor sets to each other.

In contrast, in the ladder resistor 100 according to the fifth embodiment, since each of the normal resistor group 1 and the reverse resistor group 2 is divided into an odd number of resistor sets, and therefore a tap corresponding to a reference voltage which corresponds to an A/D conversion result that will change at most bits thereof when incremented by 1, and another tap corresponding to another reference voltage which corresponds to the A/D conversion result that has changed are included in the same resistor set, distortions can be reduced from A/D conversion results of an input analog voltage that changes continuously.

In the following, a case where the ladder resistor 100 of the fifth embodiment is applied to the successive approximation ADC shown in FIG. 7 will be explained.

The ladder resistor 100 divides the difference between two fixed voltages VRT and VRB applied thereto from outside the successive approximation ADC or generated in the ADC into 64(=$2^6$) steps. The ladder resistor 100 can thus generate 64 reference voltages, and select one of them and output the selected reference voltage to a DAC 400 as shown in FIG. 7. Each of the 12-to-1 selector 5 and the first through fourth 13-to-1 selectors 6A to 6D is controlled by a control signal from a latch/control circuit 700 as shown in FIG. 7. Each of the 12-to-1 selector 5 and the first through fourth 13-to-1 selectors selects one reference voltage from among 12 or 13 reference voltages generated by the corresponding resistor set and outputs the selected reference voltage. The 5-to-1 selector 7 is similarly controlled by the control signal from the latch/control circuit 700, and selects one reference voltage from among five reference voltages selected by the 12-to-1 selector 5 and the first through fourth 13-to-1 selectors 6A to 6D and outputs the selected reference voltage to the DAC 400. The ladder resistor 100 thus outputs one reference voltage selected by the latch/control circuit 700 to the DAC 400.

In the ladder resistor according to the fifth embodiment, the normal resistor group 1 has a common-centroid arrangement relationship with the reverse resistor group 2, as shown in FIG. 5. In addition, since the normal resistor group 1 and the reverse resistor group 2 are arranged so that they are separated from each other with respect to the direction of Y, wiring for the normal resistor group 1 and wiring for the reverse resistor group 2 do not cross each other at any point. Therefore, the ladder resistor 100 can generate the plurality of reference voltages with a high degree of accuracy.

In addition, in the ladder resistor 100 according to the fifth embodiment, since each of the normal resistor group 1 and the reverse resistor group 2 is divided into an odd number of resistor sets, and therefore a tap corresponding to a reference voltage which corresponds to an A/D conversion result that will change at most bits thereof when incremented by 1, and another tap corresponding to another reference voltage which corresponds to the A/D conversion result that has changed are included in the same resistor set. When an analog voltage having a value that changes continuously such that its equivalent digital value changes at most bits thereof when incremented by 1, e.g., an analog voltage having an equivalent digital value that will change from 1 Fh to 20 h is input to the successive approximation ADC, since the 32nd tap corresponding to 1 Fh and the 33rd tap corresponding to 20 h are included in the third resistor set of each resistor group, respectively, and therefore such a large change in A/D conversion results cannot cause distortions to occur in the A/D conversion results.

As mentioned above, in accordance with the fifth embodiment of the present invention, since the normal resistor group 1 has a common-centroid arrangement relationship with the reverse resistor group 2, and the normal resistor group 1 and the reverse resistor group 2 are arranged so that they are separated from each other with respect to the direction of Y of FIG. 5, the ladder resistor 100 can generate the plurality of reference voltages with a high degree of accuracy. In addition, since a tap corresponding to a reference voltage which corresponds to an A/D conversion result that will change at most bits thereof when incremented by 1, and another tap corresponding to another reference voltage which corresponds to the A/D conversion result that has changed are included in the same resistor set, distortions can be reduced from A/D conversion results of an input analog voltage that changes continuously.

The fifth embodiment of the present invention can be applied to either of the above-mentioned second through fourth embodiments other than the above-mentioned first embodiment.

Many widely different embodiments of the present invention may be constructed without departing from the spirit and scope of the present invention. It should be understood that the present invention is not limited to the specific embodiments described in the specification, except as defined in the appended claims.

What is claimed is:

1. A ladder resistor for generating a plurality of reference voltages, and for selecting and outputting one or more desired reference voltage from among the plurality of reference voltages, said ladder resistor comprising:

a first resistor group including a plurality of first resistor sets connected in series and disposed in parallel to one another along a first direction, each first resistor set including a plurality of first resistors connected in series and disposed along a second direction vertical to the first direction; and a second resistor group including a plurality of second resistor sets connected in series and disposed in parallel to one another along the first direction without each second resistor set being interposed between any two of said plurality of first resistors, each second resistor set including a plurality of second resistors connected in series and disposed along the second direction vertical to the first direction, the respective second resistors being located point-symmetrically with the respective first resistors with respect to a certain point.

2. The ladder resistor according to claim 1, further comprising a reference voltage selection means for selecting one tap from among a plurality of taps disposed in said first resistor group and selecting a corresponding tap from among a plurality of taps disposed in said second resistor group, and for electrically connecting the selected tap of said first resistor group to the selected tap of said second resistor group so as to selectively output one of the plurality of reference voltages generated.

3. The ladder resistor according to claim 2, wherein said reference voltage selection means includes a first selector means for selecting one tap from among the plurality of taps disposed in said first resistor group, and a second selector means for selecting a corresponding tap from among the plurality of taps disposed in said second resistor group, and wherein the taps of said first and second resistor groups are connected to one another by way of said first and second selector means, and said first and second selector means are symmetric with respect to said certain point.

4. The ladder resistor according to claim 3, further comprising a first constant voltage supply means for supplying a first constant voltage to one end of said first resistor group, a second constant voltage supply means for supplying a second constant voltage to another end of said first resistor group, a third constant voltage supply means for supplying the first constant voltage to one end of said second resistor group, and a fourth constant voltage supply means for supplying the second constant voltage to another end of said second resistor group, wherein said first and third constant voltage supply means are symmetric with respect to said certain point and said second and fourth constant voltage supply means are symmetric with respect to said certain point.

5. The ladder resistor according to claim 1, wherein the plurality of resistors included in each of said first and second resistor groups are divided into an odd number of resistor sets arranged in parallel with one another, and each of said first and second resistor groups is provided with at least one dummy resistor connected in series to the plurality of resistors included in each of said first and second resistor groups so that each of the odd number of resistor sets has an identical number of resistors.

6. The ladder resistor according to claim 2, wherein the plurality of resistors included in each of said first and second resistor groups are divided into said plurality of first resistor sets consisting of an odd number of first resistor groups, and said plurality of second register sets consisting of an odd number of second register groups arranged in parallel with one another, and a tap corresponding to a reference voltage which corresponds to an A/D conversion result that will change many bits thereof when incremented by 1, and another tap corresponding to another reference voltage which corresponds to the A/D conversion result that has changed are included in the same resistor set, and wherein each of said first and second resistor groups is provided with at least one dummy resistor connected in series to the plurality of resistors included in each of said first and second resistor groups so that each of the odd number of resistor sets has an identical number of resistors.

7. The ladder resistor according to claim 3, wherein the plurality of resistors included in each of said first and second resistor groups are divided said plurality of first resistor sets consisting of an odd number of first resistor groups, and said plurality of second register sets consisting of an odd number of second register groups arranged in parallel with one another, and a tap corresponding to a reference voltage which corresponds to an A/D conversion result that will change many bits thereof when incremented by 1, and another tap corresponding to another reference voltage which corresponds to the A/D conversion result that has changed are included in the same resistor set, and wherein each of said first and second resistor groups is provided with at least one dummy resistor connected in series to the plurality of resistors included in each of said first and second resistor groups so that each of the odd number of resistor sets has an identical number of resistors.

8. The ladder resistor according to claim 4, wherein the plurality of resistors included in each of said first and second resistor groups are divided said plurality of first register sets consisting of an odd number of first resistor groups, and said plurality of second register sets consisting of an odd number of second register groups arranged in parallel with one another, and a tap corresponding to a reference voltage which corresponds to an A/D conversion result that will change many bits thereof when incremented by 1, and another tap corresponding to another reference voltage which corresponds to the A/D conversion result that has changed are included in the same resistor set, and wherein each of said first and second resistor groups is provided with at least one dummy resistor connected in series to the plurality of resistors included in each of said first and second resistor groups so that each of the odd number of resistor sets has an identical number of resistors.

9. The ladder resistor according to claim 1, wherein said plurality of first resistor sets include at least four first resistor sets, and said plurality of second resistor sets include at least four second resistor sets.

10. The ladder resistor according to claim 2, wherein said plurality of first resistors include a head first resistor connected to a first voltage line and a last first resistor connected to a second voltage line, and said plurality of second resistors including a head second resistor connected to the first voltage line and a last second resistor connected to the second voltage line, and an electrical path of said plurality of first resistors from the head first resistor to the last first resistor and an electrical path of said plurality of second resistors from the head second resistor to the last second resistor.

* * * * *